United States Patent
Tsou

(10) Patent No.: US 8,450,135 B2
(45) Date of Patent: May 28, 2013

(54) PIXEL STRUCTURE AND MANUFACTURING METHOD THEREOF

(75) Inventor: Yuan-Hsin Tsou, Kaohsiung (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 49 days.

(21) Appl. No.: 13/183,448

(22) Filed: Jul. 15, 2011

(65) Prior Publication Data
US 2012/0292620 A1 Nov. 22, 2012

(30) Foreign Application Priority Data
May 19, 2011 (TW) .............................. 100117614 A

(51) Int. Cl.
*H01L 33/16* (2010.01)
*H01L 33/42* (2010.01)
*H01L 33/52* (2010.01)

(52) U.S. Cl.
USPC ............. 438/64; 438/714; 438/689; 438/155; 438/159; 438/149; 257/57; 257/66; 257/E33.059; 257/E21.414

(58) Field of Classification Search .................... 257/57, 257/66, E33.059, E21.414; 438/64, 714, 438/689, 155, 159, 149, 151, 158
See application file for complete search history.

(56) References Cited

U.S. PATENT DOCUMENTS

| 7,663,724 B2 | 2/2010 | Lim et al. | |
| 2001/0005596 A1* | 6/2001 | Lee et al. | 438/29 |

* cited by examiner

*Primary Examiner* — Cathy N Lam
(74) *Attorney, Agent, or Firm* — Jianq Chyun IP Office

(57) ABSTRACT

A manufacturing method of pixel structure includes: sequentially forming a gate, a gate insulation layer, a semiconductor layer and a conductive layer on a substrate; forming a first patterned photoresist layer including multiple first photoresist blocks and multiple second photoresist blocks on the conductive layer; reducing the thickness of the first patterned photoresist layer until the second photoresist blocks are completely removed; forming a pixel electrode layer and a second photoresist layer on a partial pixel electrode layer; removing a part of the pixel electrode layer exposed by the second photoresist layer, a partial conductive layer and a partial semiconductor layer both under the removed pixel electrode layer to define a first electrode block, a second electrode block and a channel region; removing the remained first patterned photoresist layer and second photoresist layer and forming a protective layer and a common electrode layer on a part of the protective layer.

7 Claims, 4 Drawing Sheets

PIXEL STRUCTURE AND MANUFACTURING METHOD THEREOF

CROSS-REFERENCE TO RELATED APPLICATION

This application claims the priority benefit of Taiwan application serial no. 100117614, filed on May 19, 2011. The entirety of the above-mentioned patent application is hereby incorporated by reference herein and made a part of this specification.

BACKGROUND OF THE INVENTION

1. Field of the Invention

The invention generally relates to a pixel structure and a manufacturing method thereof, and more particularly, to a pixel structure of a plane to line (PLS) switching display and a manufacturing method thereof.

2. Description of Related Art

Currently, all TFT liquid crystal display panels on the market are developing towards high contrast, no grayscale reverse, high luminance, high saturation, fast response and wide viewing. The common wide viewing technology includes twisted nematic (TN) plus wide viewing film liquid crystal display (LCD) panel, in-plane switching (IPS) LCD panel, fringe field switching (FFS) LCD panel and multi-domain vertical alignment (MVA) LCD panel.

Taking an FFS LCD panel as an example, this kind of panel has optical characteristics of lowest viewing color distortion (i.e., low color bias) and high transmittance, so that it is widely used in various electronic equipments serving as a planar display device. Among middle and small size panels, in order to increase aperture ratio of the pixel structure thereof, a PLS panel design based on the same control principle as the FFS LCD panel has been developed now, in which the difference between the two panels rests merely in the disposing way of pixel electrode and common electrode.

U.S. Pat. No. 7,663,724B2 discloses a pixel structure design of a PLS display, in which a semiconductor layer, a pixel electrode, a source and a drain, a protective layer and a common electrode layer are sequentially formed so as to complete a pixel structure. Since according to the design, the pixel electrode is formed prior to forming the source/the drain, the source or the drain would cover a part of the pixel electrode. Moreover, after forming the source and the drain, a back-channel etch drying process is used to remove a part of the semiconductor layer located under a place between the source and the drain, which although can avoid high off current situation, but the pixel electrode easily produces residue or debris due to the plasma bombardment method during the back-channel etch drying process step. The residue or debris of the pixel electrodes may affect the component characteristic of the semiconductor layer and the flatness of the successively formed protective layer and thereby affect the display quality of the integral display. In addition, the pixel structure is fabricated by using six photomask processes, which, relatively to the currently usual five photomask processes, has a higher fabrication cost. In short, how to solve the problem caused by the residue or debris of a pixel electrode and reduce the number of employed photomasks becomes one of important developing directions.

SUMMARY OF THE INVENTION

Accordingly, the invention is directed to a pixel structure and a manufacturing method thereof, which can solve the problem caused by the residue or debris of a pixel electrode and reduce the number of employed photomasks in the pixel structure process and further reduce the fabrication cost thereof.

The invention provides a manufacturing method of pixel structure, which includes following steps. A gate, a gate insulation layer, a semiconductor layer and a conductive layer are sequentially formed on a substrate. A first patterned photoresist layer is formed on the conductive layer, in which the first patterned photoresist layer exposes a part of the gate insulation layer and includes a plurality of first photoresist blocks and a plurality of second photoresist blocks, and the thickness of each the second photoresist block is less than the thickness of each the first photoresist block. The thickness of the first patterned photoresist layer is reduced until the second photoresist blocks are completely removed to expose a part of the conductive layer. A pixel electrode layer is formed on a part of the gate insulation layer, the remained first patterned photoresist layer and a part of the conductive layer. A second photoresist layer is formed on a part of the pixel electrode layer, in which the first patterned photoresist layer and the second photoresist layer are not overlapped with each other. The second photoresist layer is taken as an etching mask to remove a part of the pixel electrode layer exposed by the second photoresist layer, a part of the conductive layer and a part of the semiconductor layer both under the removed pixel electrode layer, so that a first electrode block and a second electrode block are defined at the conductive layer and a channel region is defined at the semiconductor layer. The remained first patterned photoresist layer and the second photoresist layer are removed to expose the first electrode block, the second electrode block and the pixel electrode layer. A protective layer is formed to cover the first electrode block, the second electrode block, the channel region, the pixel electrode layer and a part of the gate insulation layer. A common electrode layer is formed on a part of the protective layer.

In an embodiment of the present invention, the above-mentioned step of forming the first patterned photoresist layer includes: forming a first photoresist layer on the conductive layer; providing a graylevel photomask over the first photoresist layer, in which the graylevel photomask has at least a transparent region, a plurality of half-tone regions and a plurality of opaque regions; and using the graylevel photomask to perform an exposing step and a developing step on the first photoresist layer to form the first patterned photoresist layer, in which the positions of the first photoresist blocks are respectively corresponding to the positions of the opaque regions and the positions of the second photoresist blocks are respectively corresponding to the positions of the half-tone regions.

In an embodiment of the present invention, the above-mentioned manufacturing method of pixel structure further includes: prior to reducing the thickness of the first patterned photoresist layer, taking the first patterned photoresist layer as an etching mask to perform an etching process so as to expose a part of the gate insulation layer, in which the position of the exposed gate insulation layer is corresponding to the position of the transparent region.

In an embodiment of the present invention, the above-mentioned method of reducing the thickness of the first patterned photoresist layer includes performing an ashing process.

In an embodiment of the present invention, a material of the above-mentioned pixel electrode layer includes indium tin oxide (ITO) or indium zinc oxide (IZO).

In an embodiment of the present invention, the above-mentioned first electrode block and second electrode block are located under the remained first patterned photoresist layer and disposed on both sides of the channel region.

In an embodiment of the present invention, the above-mentioned step of removing the remained first patterned photoresist layer and the second photoresist layer includes lift-off process.

The invention provides also a pixel structure, which is disposed on a substrate. The pixel structure includes a gate, a gate insulation layer, a semiconductor layer, a conductive layer, a pixel electrode layer, a protective layer and a common electrode layer. The gate is disposed on the substrate. The gate insulation layer is disposed on the substrate and covers the gate. The semiconductor layer is disposed on the gate insulation layer and has a channel region. The conductive layer is disposed on the semiconductor layer and includes a first electrode block and a second electrode block, in which the first electrode block and the second electrode block are located on both sides of the channel region. The pixel electrode layer is disposed on the conductive layer and locally covers the second electrode block. The protective layer covers the conductive layer, the pixel electrode layer and the channel region. The common electrode layer is disposed on a part of the protective layer.

In an embodiment of the present invention, a material of the above-mentioned pixel electrode layer includes indium tin oxide (ITO) or indium zinc oxide (IZO).

In an embodiment of the present invention, the above-mentioned first electrode block is a source block and the second electrode block is a drain block.

Based on the depiction above, according to the manufacturing method of pixel structure of the invention, after forming the pixel electrode layer on the conductive layer, then the first electrode block (source), the second electrode block (drain) and the channel region of the semiconductor layer are defined. In comparison with the prior art, the invention can reduce the number of the employed photomasks to reduce the fabrication cost and can solve the problem caused by the residue or debris of the pixel electrodes.

Other objectives, features and advantages of the present invention will be further understood from the further technological features disclosed by the embodiments of the present invention in which there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1A:
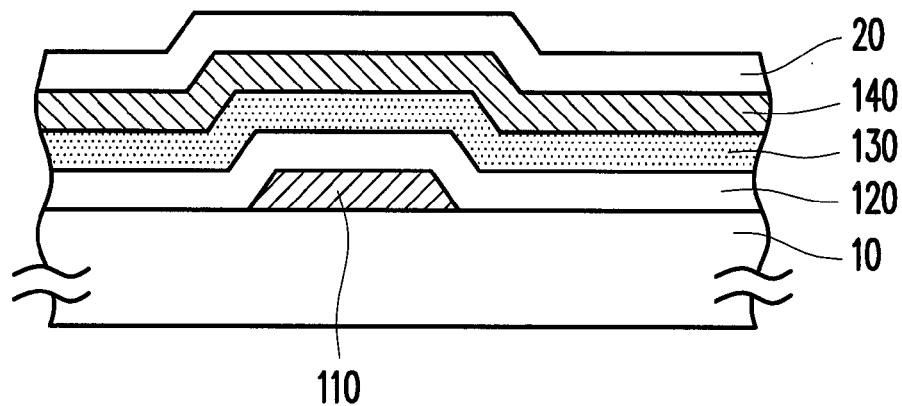
FIGS. 1A-1H are schematic cross-sectional diagrams showing a manufacturing method of pixel structure according to an embodiment of the invention.

FIGS. 1A-1H are schematic cross-sectional diagrams showing a manufacturing method of pixel structure according to an embodiment of the invention. Referring FIG. 1A, the manufacturing method of pixel structure of the invention includes following steps. First, a gate 110, a gate insulation layer 120, a semiconductor layer 130, a conductive layer 140 and a first photoresist layer 20 are sequentially formed on a substrate 10, in which the substrate 10 is, for example, a glass substrate, a flexible substrate or other substrates with appropriate materials.

Figure 1B:
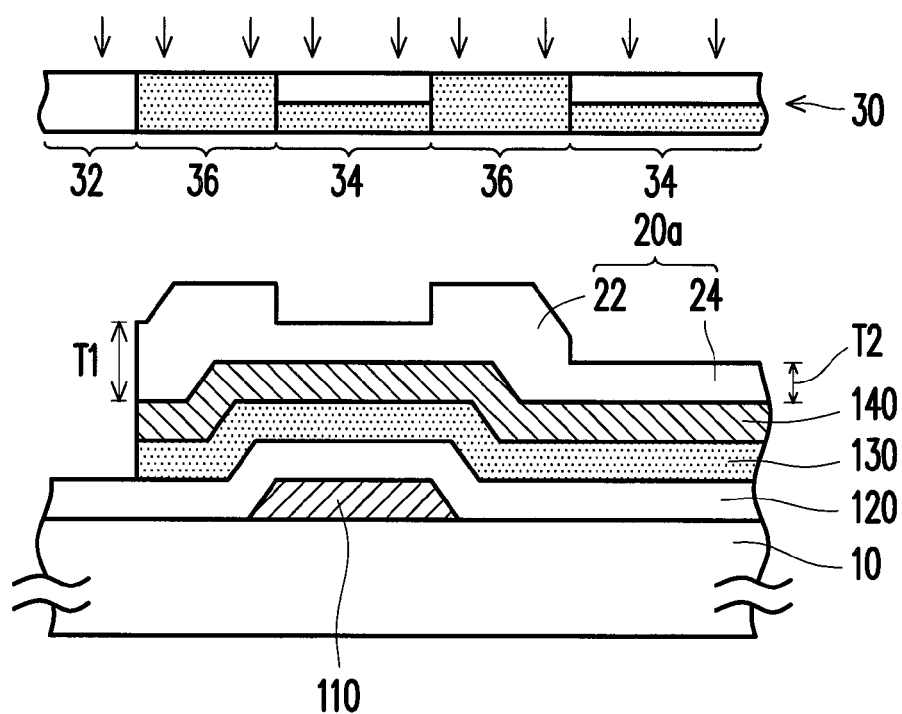

Next, referring to FIG. 1B, a graylevel photomask 30 over the first photoresist layer 20 is provided, in which the graylevel photomask 30 has at least a transparent region 32, a plurality of half-tone regions 34 and a plurality of opaque regions 36. Then, the graylevel photomask 30 is used to perform an exposing step and a developing step on the first photoresist layer 20 to form a first patterned photoresist layer 20a. The first patterned photoresist layer 20a includes a plurality of first photoresist blocks 22 and a plurality of second photoresist blocks 24, in which a second thickness T2 of each second photoresist block 24 is less than a first thickness T1 of each first photoresist block 22, and the position of each first photoresist block 22 is respectively corresponding to the position of the opaque region 36 of the graylevel photomask 30, while the position of each second photoresist block 24 is respectively corresponding to the position of the half-tone regions 34 of the graylevel photomask 30.

With reference to FIG. 1B, the first patterned photoresist layer 20a serves as an etching mask to perform an etching process so as to expose a part of the gate insulation layer 120, in which the position of the exposed partial gate insulation layer 120 is corresponding to the position of the transparent region 32 of the graylevel photomask 30.

Figure 1C:
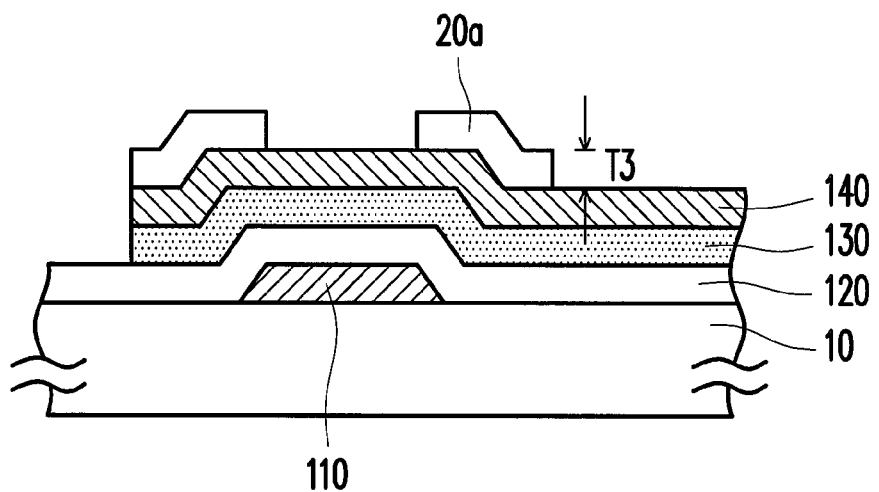

Further referring to FIGS. 1B and 1C, the thickness of the first patterned photoresist layer 20a is reduced until the second photoresist blocks 24 are completely removed so as to expose a part of the conductive layer 140. At the time, the first patterned photoresist layer 20a has a third thickness T3 less than the first thickness T1. The method of reducing the thickness of the first patterned photoresist layer 20a herein is, for example, performing an ashing process.

Figure 1D:
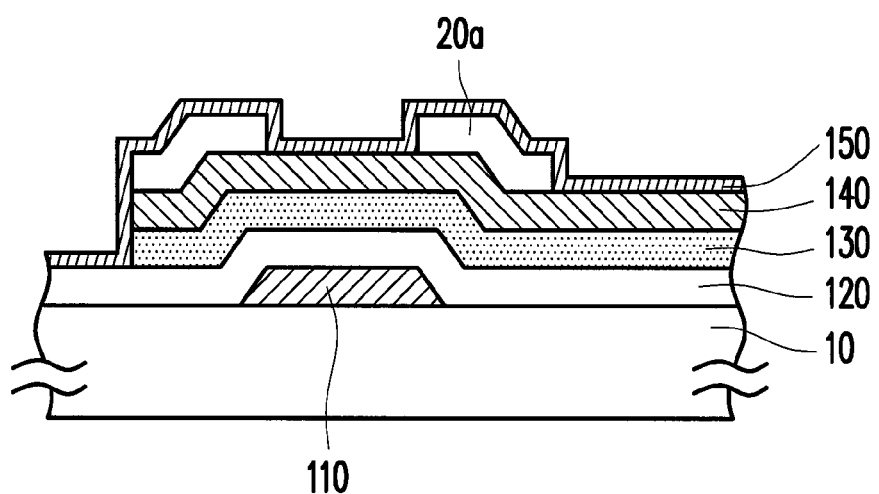

Further referring to FIG. 1D, a pixel electrode layer 150 is formed on a part of the gate insulation layer 120, the remained first patterned photoresist layer 20a and a part of the conductive layer 140, in which the material of the pixel electrode layer 150 includes ITO or IZO.

Figure 1E:
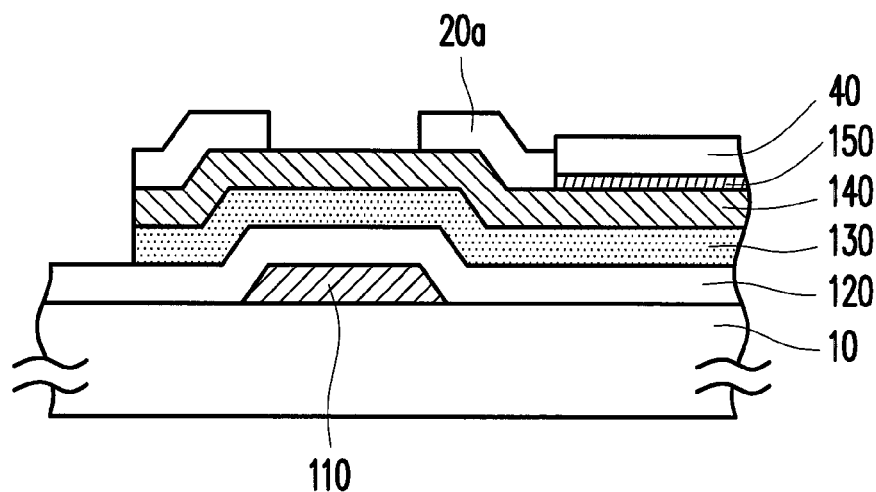

Further referring to FIG. 1E, a second photoresist layer 40 is formed on a part of the pixel electrode layer 150, in which the first patterned photoresist layer 20a and the second photoresist layer 40 are not overlapped with each other.

Figure 1F:
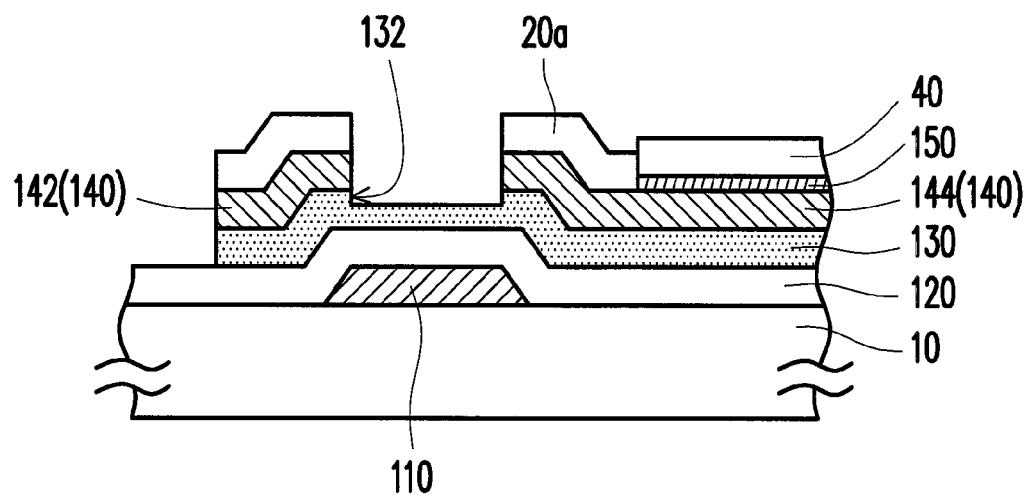

Further referring to FIGS. 1E and 1F, the second photoresist layer 40 serves as an etching mask to remove a part of the pixel electrode layer 150 exposed by the second photoresist layer 40, a part of the conductive layer 140 and a part of the semiconductor layer 130 both under the removed pixel electrode layer, so that a first electrode block 142 and a second electrode block 144 are defined at the conductive layer 140 and a channel region 132 is defined at the semiconductor layer 130. The method of removing a part of the pixel electrode layer 150 exposed by the second photoresist layer 40, a part of the conductive layer 140 and a part of the semiconductor layer 130 both under the removed pixel electrode layer is, for example, performing a back-channel etch drying process. At the time, the first electrode block 142 and the second electrode block 144 are located under the remained first patterned photoresist layer 20a and disposed on both sides of the channel region 132 of the semiconductor layer 130. In addition, the first electrode block 142 is, for example, a source block and the second electrode block 144 is, for example, a drain block.

Figure 1G:
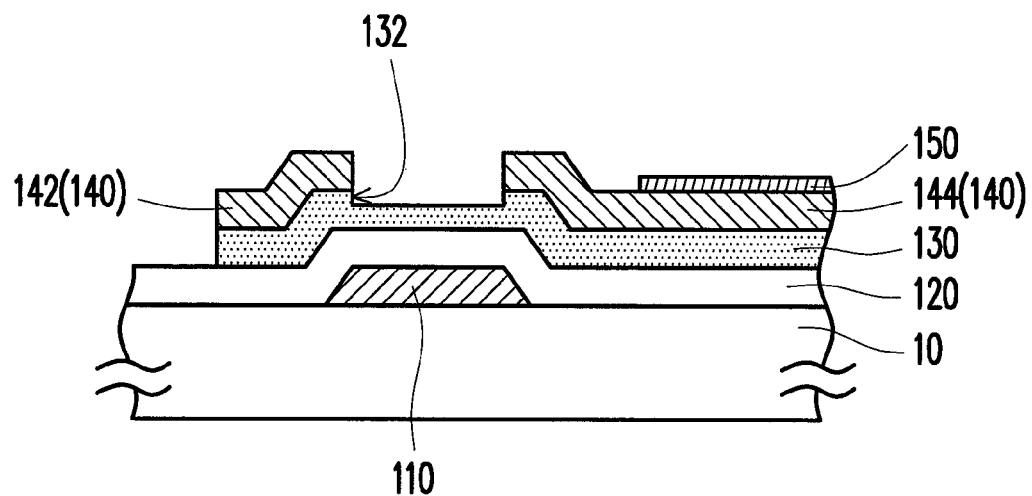

Moreover, referring to FIG. 1G, the remained first patterned photoresist layer 20a and the second photoresist layer 40 are removed to expose the first electrode block 142, the second electrode block 144 and the pixel electrode layer 150, in which the method of removing the remained first patterned photoresist layer 20a and the second photoresist layer 40 is, for example, performing a lift-off process.

Figure 1H:
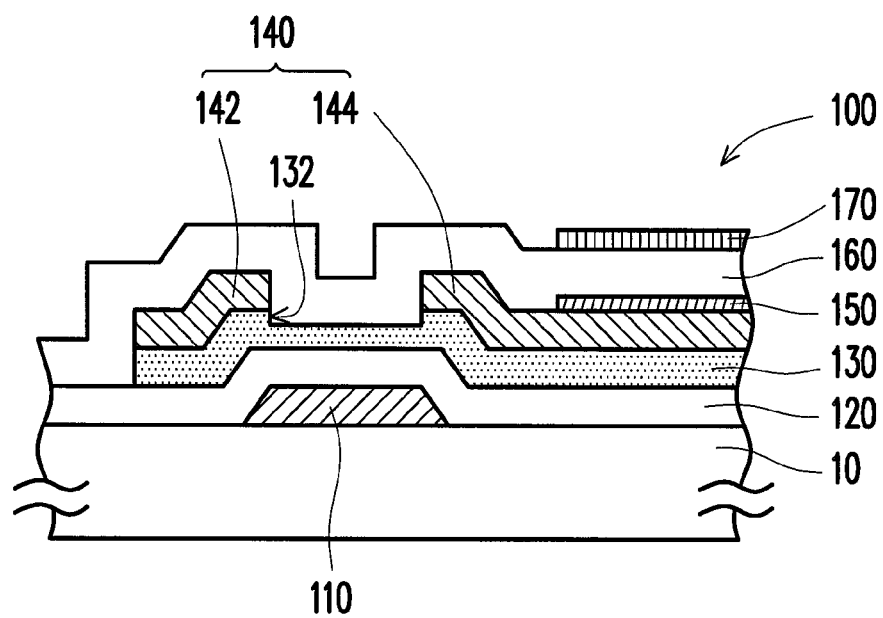

Finally referring to FIG. 1H, a protection layer 160 is formed to cover the first electrode block 142, the second electrode block 144, the channel region 132 of the semiconductor layer 130, the pixel electrode layer 150 and a part of the gate insulation layer 120, followed by forming a common electrode layer 170 on a part of the protection layer 160 to complete the pixel structure 100.

In terms of the structure design, referring to FIG. 1H, a pixel structure 100 of the embodiment is disposed on a substrate 10, in which the pixel structure 100 includes a gate 110, a gate insulation layer 120, a semiconductor layer 130, a conductive layer 140, a pixel electrode layer 150, a protection layer 160 and a common electrode layer 170. The gate 110 is disposed on the substrate 10. The gate insulation layer 120 is disposed on the substrate 10 and covers the gate 110. The semiconductor layer 130 is disposed on the gate insulation layer 120 and has a channel region 132. The conductive layer 140 is disposed on the semiconductor layer 130 and includes a first electrode block 142 and a second electrode block 144, in which the first electrode block 142 and the second electrode block 144 are located on both sides of the channel region 132 of the semiconductor layer 130, and the first electrode block 142 is, for example, a source block and the second electrode block 144 is, for example, a drain block. The pixel electrode layer 150 is disposed on the conductive layer 140 and locally covers the second electrode block 144. The protection layer 160 covers the conductive layer 140, the pixel electrode layer 150 and the channel region 132 of the semiconductor layer 130. The common electrode layer 170 is disposed on a part of the protection layer 160.

According to the manufacturing method of the pixel structure 100 of the embodiment, the graylevel photomask 30 is utilized to change the process sequence; that is, after forming the pixel electrode layer 150 on the conductive layer 140, then the first electrode block 142 and the second electrode block 144 of the conductive layer 140 and the channel region 132 of the semiconductor layer 130 are defined. In this way, the manufacturing method of the pixel structure 100 in the embodiment can save one photomask process (reducing the number of the employed photomasks) to reduce the fabrication cost and can solve the conventional problem caused by the residue or debris of the pixel electrodes. In addition, at the time of forming the pixel electrode layer 150, the first electrode block 142 and the second electrode block 144 are not defined at the conductive layer 140 yet, i.e., the conductive layer 140 still completely covers and is disposed on the semiconductor layer 130, so that no pixel electrode layer 150 seeps into the semiconductor layer 130 during forming the pixel electrode layer 150; and as a result, the component characteristic of the semiconductor layer 130 is maintained.

In summary, since the manufacturing method of pixel structure of the invention is, first, to form the pixel electrode layer on the conductive layer and then, to define the first electrode block (source), the second electrode block (drain) and the channel region of the semiconductor layer, so that in comparison with the prior art, the invention can reduce the number of the employed photomasks to reduce the fabrication cost and can solve the conventional problem caused by the residue or debris of the pixel electrodes.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive.

What is claimed is:

1. A manufacturing method of pixel structure, comprising:
   sequentially forming a gate, a gate insulation layer, a semiconductor layer and a conductive layer on a substrate;
   forming a first patterned photoresist layer on the conductive layer, wherein the first patterned photoresist layer exposes a part of the gate insulation layer and comprises a plurality of first photoresist blocks and a plurality of second photoresist blocks, and a thickness of each of second photoresist block is less than the thickness of each the first photoresist block;
   reducing a thickness of the first patterned photoresist layer until the second photoresist blocks are completely removed to expose a part of the conductive layer;
   forming a pixel electrode layer on a remained first pattern photoresist layer, the remained first patterned photoresist layer and the part of the conductive layer;
   forming a second photoresist layer on a part of the pixel electrode layer, wherein the first patterned photoresist layer and the second photoresist layer are not overlapped with each other;
   taking the second photoresist layer as an etching mask to remove the part of the pixel electrode layer exposed by the second photoresist layer, the part of the conductive layer and a part of the semiconductor layer both under the removed pixel electrode layer, so that a first electrode block and a second electrode block are defined at the conductive layer and a channel region is defined at the semiconductor layer;
   removing the remained first patterned photoresist layer and the second photoresist layer to expose the first electrode block, the second electrode block and the pixel electrode layer;
   forming a protective layer to cover the first electrode block, the second electrode block, the channel region, the pixel electrode layer and the part of the gate insulation layer; and
   forming a common electrode layer on a part of the protective layer.

2. The manufacturing method of pixel structure as claimed in claim 1, wherein the step of forming the first patterned photoresist layer further comprises:
   forming a first photoresist layer on the conductive layer;
   providing a graylevel photomask over the first photoresist layer, wherein the graylevel photomask has at least a transparent region, a plurality of half-tone regions and a plurality of opaque regions; and
   using the graylevel photomask to perform an exposing step and a developing step on the first photoresist layer to form the first patterned photoresist layer, wherein a position of the first photoresist block are respectively corresponding to a position of the opaque regions and a positions of the second photoresist blocks are respectively corresponding to a position of the half-tone regions.

3. The manufacturing method of pixel structure as claimed in claim 2, further comprising:
   prior to reducing a thickness of the first patterned photoresist layer, taking the first patterned photoresist layer as an etching mask to perform an etching process to expose the part of the gate insulation layer, wherein a portion of the exposed gate insulation layer is corresponding to a portion of the transparent region.

4. The manufacturing method of pixel structure as claimed in claim 1, wherein the step of reducing the thickness of the first patterned photoresist layer further comprises performing an ashing process.

5. The manufacturing method of pixel structure as claimed in claim 1, wherein a material of the pixel electrode layer comprises indium tin oxide (ITO) or indium zinc oxide (IZO).

6. The manufacturing method of pixel structure as claimed in claim 1, wherein the first electrode block and the second electrode block are located under the remained first patterned photoresist layer and disposed on both sides of the channel region.

7. The manufacturing method of pixel structure as claimed in claim 1, wherein the step of removing the remained first patterned photoresist layer and the second photoresist layer further comprises lift-off process.

* * * * *